United States Patent [19]

Kondou et al.

[11] Patent Number: 4,860,235
[45] Date of Patent: Aug. 22, 1989

[54] ARITHMETIC UNIT WITH ALTERNATE MARK INVERSION (AMI) CODING

[75] Inventors: Harufusa Kondou; Hideki Ando, both of Hyogo, Japan

[73] Assignee: Mitsubishi Denki Kabushiki Kaisha, Tokyo, Japan

[21] Appl. No.: 132,644

[22] Filed: Dec. 8, 1987

[30] Foreign Application Priority Data

Dec. 10, 1986 [JP] Japan ................................. 61-293715

[51] Int. Cl.$^4$ .............................................. G06F 7/38
[52] U.S. Cl. ..................................... 364/716; 364/769; 340/146.2
[58] Field of Search ............................ 364/716, 769; 340/146.2

[56] References Cited

U.S. PATENT DOCUMENTS

| | | | |
|---|---|---|---|
| 3,434,109 | 3/1969 | Coote | 364/769 X |
| 3,955,177 | 5/1976 | Miller | 340/146.2 |
| 4,767,949 | 8/1988 | Mayweather, III | 340/146.2 X |

FOREIGN PATENT DOCUMENTS

| | | |
|---|---|---|
| 3702204 | 8/1987 | Fed. Rep. of Germany . |
| 187929 | 8/1987 | Japan . |

OTHER PUBLICATIONS

Mano, "Digital Logic and Computer Design", Prentice Hall, 1979, Chapter 2, Sections 2.4 and 2.6.
Ho et al., "Comparator Compares 2's Complement Numbers", *Electronics*, Aug. 25, 1983, pp. 138–139.

*Primary Examiner*—Gary V. Harkcom
*Assistant Examiner*—Tan V. Mai
*Attorney, Agent, or Firm*—Lowe, Price, LeBlanc, Becker & Shur

[57] ABSTRACT

An arithmetic unit having true and false deciding circuits (21 to 24) for receiving a first input signal A and a second input signal B to output the second input signal or complement of the same in response to the sign (most significant bit value) of the second input signal. The arithmetic unit further includes an adder (31 to 34) for receiving the first input signal A and output (M) from the true and false deciding circuits to output either $A+M$ or $A+M+1$ in response to the sign (most significant bit value) of the second input signal B and an AND gate (50) for receiving the most significant bit $F_4$ of output F from the adder and the most significant bit value $B_4$ of the second input signal B. The arithmetic unit thus outputs the alternate mark inversion (AMI) code of the input signal B having the output of the AND gate (50) as a high order bit and the most significant bit $F_4$ of the output F of the adder as a low order bit, with a threshold value of the input signal A.

7 Claims, 4 Drawing Sheets

ARITHMETIC UNIT WITH ALTERNATE MARK INVERSION (AMI) CODING

BACKGROUND OF THE INVENTION

1. Field of the Invention

The present invention relates to an arithmetic unit, and more particularly, it relates to the structure of an arithmetic unit which can functionally execute alternate mark inversion (AMI) coding of an input signal in one machine cycle.

2. Description of the Prior Art

FIG. 1 is a block diagram showing the structure of a conventional basic four-bit arithmetic unit.

Referring to FIG. 1, the conventional arithmetic unit comprises an operation part 100 for performing desired arithmetic operations and a control circuit 10 for designating the type of the arithmetic operation to be performed by the operation part 100.

The control circuit 10 has input terminals $1_S$, $2_S$, $3_S$ and $4_S$ for receiving function selecting signals $S_1$, $S_2$, $S_3$ and $S_4$ externally supplied for designating the type of arithmetic operation and output terminals H, I and J for respectively outputting control signals $T_1$, $T_2$ and C in a prescribed combination in response to the combination of the function selecting signals $S_1$ to $S_4$. The control circuit 10 is formed by a PLA (programmable logic array), for example.

In response to the control signals $T_1$, $T_2$ and C received from the control circuit 10, the operation part 100 performs the arithmetic operation designated by the function selecting signals $S_1$ to $S_4$ on input signals A and B.

The input signal A is formed by four bit signals $A_1$, $A_2$, $A_3$ and $A_4$ and the input signal B is formed by four bit signals $B_1$, $B_2$, $B_3$ and $B_4$. The operation part 100 is provided with true and false selecting circuits 21 to 24 each receiving an input signal $B_i$ (i=1 to 4) to output one of $B_i$, $\overline{B}_i$, 1 and 0 in response to the control signals $T_1$ and $T_2$ and full adders 31 to 34 each receiving an input signal $A_i$ (i=1 to 4) and output $M_i$ (i=1 to 4) from one of the true and false selecting circuit 21 to 24 and adding up the same to output a sum signal $F_i$ (i=1 to 4) and a carry $C_i$ (i=1 to 4).

The true and false selecting circuit 21 is provided with an input terminal O for receiving the input signal $B_1$, input terminals P and Q for receiving the control signals $T_1$ and $T_2$ respectively and a terminal T for outputting a signal $M_1$. The full adder 31 is provided with a carry input U for receiving the control signal C from the control circuit 10, input terminals X and Y for receiving the input signals $A_1$ and $M_1$ respectively, a terminal V for outputting a sum signal $F_1$ as the result of addition and a terminal W for outputting a carry $C_1$.

The true and false selecting circuit 22 is provided with an input terminal O for receiving the input signal $B_2$, terminals P and Q for receiving the control signals $T_1$ and $T_2$ respectively and a terminal R for outputting a signal $M_2$. The full adder 32 is provided with a terminal U for receiving the carry output from the full adder 31, terminals X and Y for receiving the input signals $A_2$ and $M_2$ respectively, a terminal V for outputting a sum signal $F_2$ as the result of addition and a terminal W for outputting a carry $C_2$.

The true and false selecting circuit 23 has a terminal O for receiving the input signal $B_3$, terminals P and Q for receiving the control signals $T_1$ and $T_2$ and a terminal R for outputting a signal $M_3$. The full adder 33 has a terminal X for receiving the input signal $A_3$, a terminal Y for receiving the signal $M_3$, a terminal V for outputting a sum signal $F_3$ as the result of addition, a terminal W for outputting a carry $C_3$ and a terminal U for receiving the carry $C_2$ from the full adder 32.

The true and false selecting circuit 24 has a terminal O for receiving the input signal $B_4$, terminals P and Q for receiving the control signals $T_1$ and $T_2$ respectively and a terminal R for outputting a signal $M_4$. The full adder 34 has a terminal U for receiving the carry $C_3$ from the full adder 33, a terminal X for receiving the input signal $A_4$, a terminal Y for receiving the signal $M_4$, a terminal V for outputting a sum signal $F_4$ as the result of addition and a terminal W for outputting a carry $C_4$.

The aforementioned structure is adapted to output A+M+C through combination of the control signals $T_1$, $T_2$ and C.

FIG. 2 is a logic diagram showing specific structure of each true and false selecting circuit as shown in FIG. 1. Referring to FIG. 2, the true and false selecting circuit is provided with an AND gate 41 for receiving an input signal $B_i$ and the control signal $T_2$, an inverter 40 for inverting the input signal $B_i$ and outputting the same, an AND gate 42 for receiving output $\overline{B}_i$ from the inverter 40 and the control signal $T_1$ and an OR gate 43 for receiving the outputs from the AND gates 41 and 42 to output a signal $M_i$.

In the aforementioned structure, one of $B_i$, $\overline{B}_i$, 1 and 0 is selectively outputted as the signal $M_i$ in accordance with the control signals $T_1$ and $T_2$, in the following manner:

(1) When $T_1$="0" and $T_2$="0":
Both of the AND gates 41 and 42 are disabled to output "0". Thus,
$M_i$="0"

(2) When $T_1$="0" and $T_2$="1":
The AND gate 41 is enabled and the AND gate 42 is disabled. Thus, the AND gate 42 outputs $B_i$ and the AND gate 41 outputs "0", and hence:
$M_i$=$B_i$ (3) When $T_1$="1" and $T_2$="0":
The AND gate 41 is disabled and the AND gate 42 is enabled. Thus, the AND gate 41 outputs "0" and the AND gate 41 outputs $\overline{B}_i$, and hence,
$M_i$=$\overline{B}_i$, i.e., complement on $B_i$ is transferred.

(4) When $T_1$="1" and $T_2$="1":
Both of the AND gates 41 and 42 are enabled. Since either $B_i$ or $\overline{B}_i$ is "1", one input of the OR gate 43 is "1" and hence:
$M_i$="1"

Thus, the true and false selecting circuit outputs one of $B_i$, $\overline{B}_i$, 1 and 0 as the signal $M_i$ by combination of the control signals $T_1$ and $T_2$.

Since the four full adders 31 to 34 form a four-bit adder, four-bit output F=($F_1$, $F_2$, $F_3$, $F_4$) from the full adder 31 to 34 is:

$$F = A + M + C$$

The values of M and C are decided through combination of the function selecting signals $S_1$ to $S_4$, whereby the arithmetic unit can perform arithmetic operation designated by the function selecting signals $S_1$ to $S_4$ with respect to the input signals A and B to output the same.

Relation between the control signals $T_1$, $T_2$ and C and the output F is as shown in Table 1, whereby eight types or arithmetic operation can be performed.

TABLE 1

| $T_1$ | $T_2$ | C | $M_i$* | Operation Output | Function |
|---|---|---|---|---|---|
| 0 | 0 | 0 | 0 | F = A | transfer A |
| 0 | 0 | 1 | 0 | F = A + 1 | increment A |
| 0 | 1 | 0 | B | F = A + B | add B to A |
| 0 | 1 | 1 | B | F = A + B + 1 | add B to A + 1 |
| 1 | 0 | 0 | $\overline{B}$ | F = A + $\overline{B}$ | add one's complement on B to A |
| 1 | 0 | 1 | $\overline{B}$ | F = A + $\overline{B}$ + 1 | add two's complement on B to A |
| 1 | 1 | 0 | 1 | F = A − 1 | decrement A |
| 1 | 1 | 1 | 1 | F = A | transfer A |

*i = 1, 2, 3, 4

Consider that the input signal A is a threshold value (input signal A is assumed to be positive), which is compared with the input signal B to perform three-level decision as follows:

(1) If A<B, then output 1;
(2) If −A≦|B|≦A, then output 0; and
(3) If B<−A, then output −1.

In fact, this three-level decision corresponds to AMI (alternate mark inversion) coding usually employed in the field of wired digital transmission.

Such AMI coding is performed in a line terminals such as a short-haul modem in a baseband transmission system. Such a line terminals is employed for relatively local connection of a computer and a terminal or extension of an external dedicated line. This line terminals is further adapted to transfer digital data from a subscriber to a nearby station in order to connect the subscriber's terminal to a digital data network.

FIGS. 3(a) and 3(b) are diagrams for illustrating AMI coding. FIG. 3(a) shows exemplary behavior of the input signal B with respect to the input signal A (threshold value), and FIG. 3(b) shows relation between the value of the input signal B and those of threshold values A and −A.

As shown in FIG. 3(a), the input signal B is sampled at predetermined time interval to compare the sampled value B with the threshold values A and −A. In response to relation between the sampled value B and the threshold values A and −A, one of the values 1, 0 and −1 is outputted as shown in the above expression (1), (2) or (3). The input signal B is thus AMI coded.

The arithmetic unit as shown in FIG. 1 has no function for three-level decision although the same can perform arithmetic operation, as obvious from the above description. Thus, the conventional arithmetic unit cannot perform AMI coding of the input signal B. Therefore, a register or the like is generally prepared in addition to the conventional arithmetic unit to perform AMI coding through software technique such as microprogram control.

FIG. 4 shows the algorithm for performing AMI coding in a software manner.

In this algorithm, AMI coding of an input signal B is performed through prescribed storage regions D and E of a register or a storage unit such as a memory. Referring to FIG. 4, description is now made on the AMI coding performed in a software manner.

First, a determination is made as to whether the input signal B is positive or negative (step 1). When B≧0, "1" is stored in the storage region D (step 2). Then difference A−B between the threshold value A and the input signal B is stored in the storage region E. If the input signal B is negative (B<0), −1 is stored in the storage region D (step 4). Then, the sum A+B of the threshold value A and the input signal B is stored in the storage region E.

Thereafter a determination is made as to whether the value stored in the storage region E (i.e., A−B, if B≧0; A+B, if B<0) is positive or negative (step 6). When the value stored in the storage region E is equal to or larger than zero, i.e., when E≧0, "0" is stored in the storage region D (step 7). Then the value stored in the storage region D is outputted. If E<0 at the step 6, the current value stored in the storage region D is outputted.

In this algorithm, the value of the input signal B is compared with that of the input signal A being a threshold value after a determination is made as to whether the input signal B is positive or negative, to output AMI code. However, this algorithm includes two condition judgements as well as substitution and arithmetic operation, whereby at least several machine cycles are required for executing AMI coding.

Thus, the conventional arithmetic unit has no function for AMI coding of an input signal, and hence the input signal has been generally AMI coded in a software manner. Thus, several machine cycles have been required for executing AMI coding of the input signal, leading to increase in time.

The structure of the operation part of the aforementioned arithmetic unit and the design logic of a general arithmetic unit are described in "Digital Logic and Computer Design" by M. MORRIS MANO, Chapter 2, Sections 2.4 to 2.6, 1979, published by Prentice-Hall and translated into Japanese and published by Kyoritsu Shuppan.

Related art of the present invention is described in "Arithmetic and Logic Operation Unit", U.S. patent application Ser. No. 021,666 corresponding to Japanese Patent Application No. 31121/1986 filed in the name of the inventor and assigned to the assignee of this case. This related art is different in idea of the algorithm for AMI coding from the present invention, and is complicated in circuit structure.

SUMMARY OF THE INVENTION

An object of the present invention is to provide an arithmetic unit which includes the capability of executing AMI coding in one machine cycle by simple hardware structure The arithmetic unit according to the present invention generates first, second and third control signals being in a combination of prescribed values in response to function selecting signals. The function selecting signals designate the operating function and the sign of a second input signal B to be AMI coded. The arithmetic unit selectively outputs the input signal B or complement of the same in response to the first and second control signals and means for adding up the output (M) selectively outputted means, a first input signal (A) serving as a threshold value for AMI coding and the third control signal. The arithmetic unit function outputs the AMI code of the second input signal B from the most significant bit ($F_4$) of output F from the addition means and a bit value indicating the sign of the second input signal B.

In the aforementioned structure, the third control signal is 1 when the second input signal is positive or 0, so that selective passing means passes complement on the second input signal. The third control signal is 0 when the second input signal is negative, so that the selective passing means passes the second input signal. Thus, either $F=A+\overline{B}+1$ or $F=A+B$ is calculated and outputted in response to the second input signal being positive, negative or 0. Symbol A represents the first input signal and symbol F represents the output of the addition means. Thus, three-level decision of the relation between the second input signal B and the first input signal A, i.e., AMI coding can be performed through the sign of the output signal F and that of the second input signal B. The aforementioned structure is entirely of hardware employing no software, whereby AMI coding of the input signal B can be performed in one machine cycle.

These and other objects, features, aspects and advantages of the present invention will become more apparent from the following detailed description of the present invention when taken in conjunction with the accompanying drawings.

DESCRIPTION OF THE PREFERRED EMBODIMENT

Figure 5:
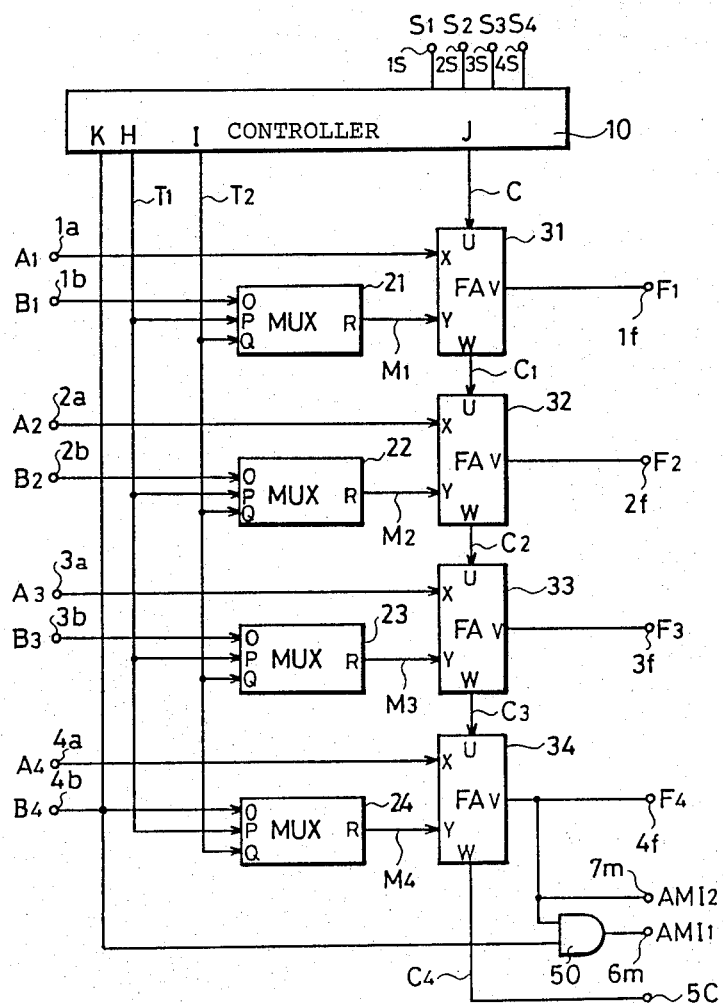
FIG. 5 illustrates the structure of an arithmetic unit having an AMI coding function according to an embodiment of the present invention.

FIG. 5 illustrates the structure of an arithmetic unit according to an embodiment of the present invention.

Figure 1:
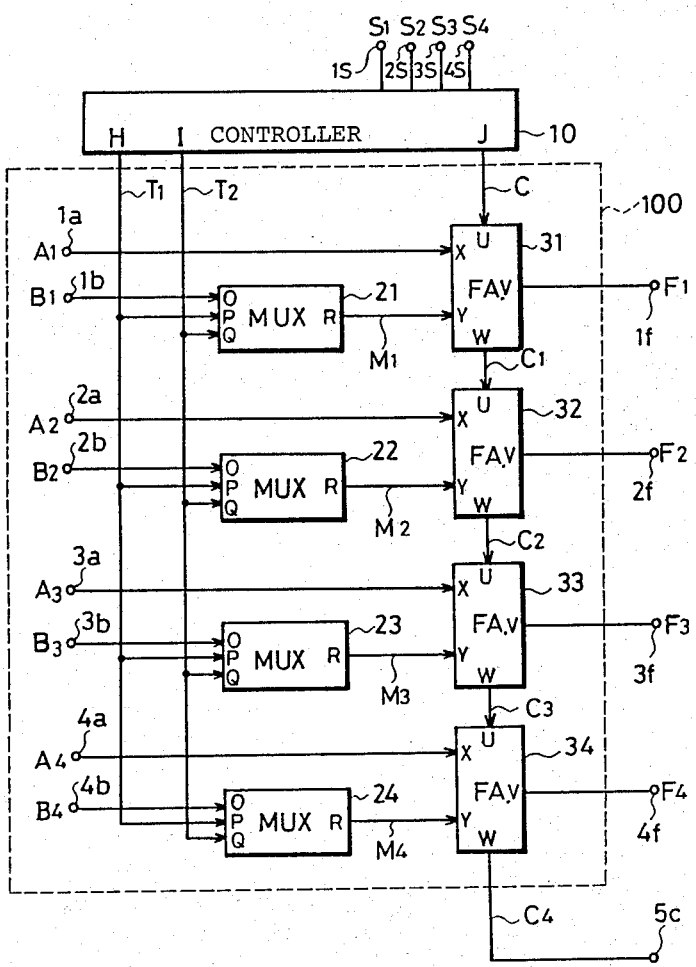
FIG. 1 illustrates the structure of a conventional basic four-bit arithmetic unit.
Figure 2:
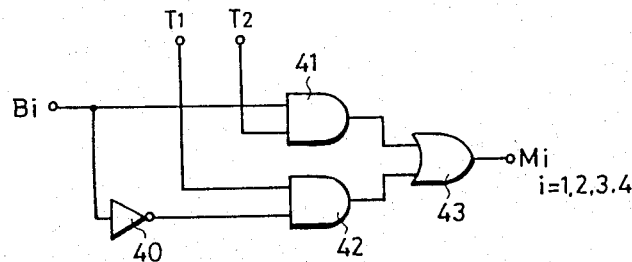
FIG. 2 shows exemplary structure of a true and false selecting circuit as shown in FIG. 1.

In addition to the structure of the conventional arithmetic unit as shown in FIG. 1, the inventive structure as shown in FIG. 5 is provided with an AND gate 50 for receiving the most significant bit $B_4$ of an input signal B and a sum signal $F_4$ (the most significant bit of operation result F) from a full adder 34. Namely, one input of the AND gate 50 is connected to a terminal 4b and the other input is connected to an output terminal V of the full adder 34. The output terminal V of the full adder 34 is connected also to an output terminal 7m.

The input terminal 4b for receiving the most significant bit $B_4$ of the input signal B is connected to an input terminal K of a control circuit 10, in order to determine whether the input signal B is positive or negative and generate control signals $T_1$, $T_2$ and C in response to the determination.

In the aforementioned structure, the input signal B is AMI coded with an input signal A (A>0) serving as a threshold value, so that the AMI code of the input signal B is outputted from output terminals 6m and 7m. The output terminal 6m outputs a first bit (high order bit) coded signal $AMI_1$ of the AMI code and the output terminal 7m outputs a second bit (low order bit) coded signal $AMI_2$.

The control circuit 10 is formed through a PLA (programmable logic array) or the like.

Description is now made on the algorithm for AMI coding of the input signal B and the operation of the arithmetic unit according to the embodiment of the present invention.

It is assumed here that both of the input signals A and B are expressed by binary numbers while the input signal A is positive and the input signal is in two's complement form. Further, it is also assumed that AMI code is expressed through binary numbers in two's complement form. Therefore, AMI code "1" is expressed by a binary number 01 (AMI coded signal $AMI_1$ is 0 and $AMI_2$ is 1) and MMI code "0" is expressed by a binary number 00 (both of AMI coded signals $AMI_1$ and $AMI_2$ are 0) while AMI code "$-1$" is expressed by a binary number 11 (both of AMI coded signals $AMI_1$ and $AMI_2$ are 1). Through the specific feature of the two's complement form, a determination can be made as to whether a signal is positive or negative by observing the value of the most significant bit (MSB) of the signal. Namely, if the MSB is 1, then the value of the signal is negative and if the MSB is 0, then the value of the signal is positive or zero. With respect to subtraction, $$A-B=A+\bar{B}+1$$

in case of the two's complement form, whereby the complement $\bar{B}$ on B and 1 may be added to A in order to subtract B from A.

In view of the aforementioned specific feature of the two's complement form, AMI coding of the input signal B with the threshold value of the input signal A may be classified as follows:

(1) When the input signal B is positive or 0, i.e., when the MSB ($B_4$) of the input signal B is 0, operated is:

$$A-B=A+\bar{B}+1=Q$$

Figure 3A:
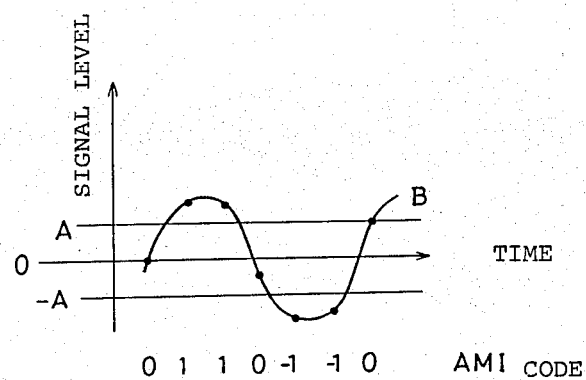
FIGS. 3(a) and 3(b) are diagrams for illustrating AMI coding.
Figure 3B:
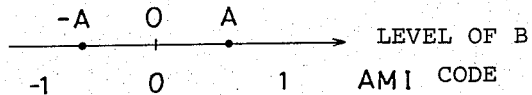
Figure 4:
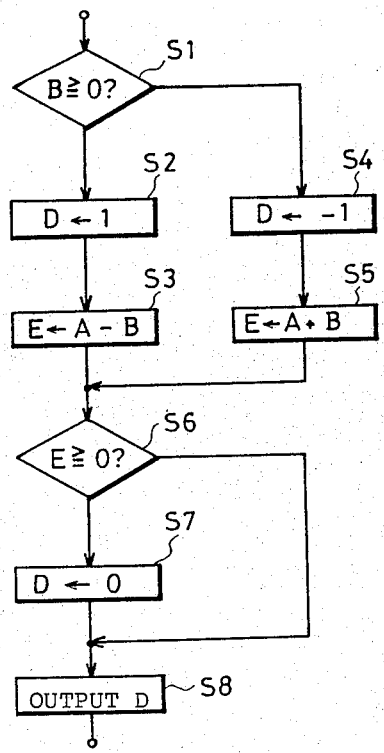
FIG. 4 is a flow diagram showing the algorithm for performing AMI coding in a software manner.

In response to the value of the operation result Q, the following AMI coded signals $AMI_1$ and $AMI_2$ are outputted:

(i) $A \geq B \geq 0$ if $Q \geq 0$, and hence the AMI code is 0 as obvious from FIG. 3, i.e., $(AMI_1, AMI_2) = (0, 0)$ (ii) $0 < A < B$ if $Q < 0$, and hence the AMI code is 1, i.e., $(AMI_1, AMI_2) = (0, 1)$ Thus, when the input signal B is positive or 0, the arithmetic unit performs the operation of $F = A + \bar{B} + 1$ to output 00 if the sum signal $F_4$ of the most significant bit of the operation result F is 0 while outputting 01 if the sum signal $F_4$ is 1. Thus, AMI coding can be performed for the input signal B being positive or 0.

(2) When the input signal B is negative, i.e., when the most significant bit $B_4$ of the input signal B is 1, operated is:

$$A+B=P$$

(i) $A \geq B$ if $P \geq 0$, and hence the AMI code of the input signal B is 0, i.e., $(AMI_1, AMI_2) = (0, 0)$ (ii) $A < B$ if $P < 0$, and hence the AMI code of the input signal B is $-1$, i.e., $(AMI_1, AMI_2) = (1, 1)$ Therefore, when the input signal B is negative, the arithmetic unit performs the operation of $A + B = F$ to output 00 if the sum signal $F_4$ of the most significant bit of the operation output F is 0 while outputting 11 if the sum signal $F_4$ of the most significant bit is 1.

The aforementioned relation may be tabled as follows:

TABLE 2

| $B_4$ (MSB of B) | Operation | $F_4$ (MSB of F) | AMI output $AMI_1$ | $AMI_2$ |
|---|---|---|---|---|
| 0 | A = B + 1 | 0 | 0 | 0 |
| 0 | A + B + 1 | 1 | 0 | 1 |
| 1 | A + B | 0 | 0 | 0 |
| 1 | A + B | 1 | 1 | 1 |

It is clear from Table 2 that the sum signal $F_4$ and the signal $B_4$ may be ANDed as the first bit coded signal $AMI_1$ and the second bit coded signal $AMI_2$ may be equalized to the sum signal $F_4$ in order to perform AMI coding of the input signal B with the threshold value of the input signal A.

With reference to the relation as shown in Table 2, description is now made on the operation of the arithmetic unit according to the embodiment of the present invention as shown in FIG. 5.

The AND gate 50 obtains the AND of the sum signal $F_4$ of the most significant bit of the operation result F with the most significant bit $B_4$ of the input signal B, to output the high order coded signal $AMI_1$. The signal from the terminal V of the full adder 34, i.e., the sum signal $F_4$ is directly employed as the low order coded signal $AMI_2$.

The control circuit 10 outputs the control signals $T_1$, $T_2$ and C so that the operation as shown in Table 2 is performed in response to the sign (i.e., the most significant bit $B_4$) of the input signal B when the function selecting signals $S_1$ to $S_4$ are combined to select the AMI coding operation function. The relation between the most significant bit $B_4$ and the control signals $T_1$, $T_2$ and C is as shown in Table 3 with reference to Table 1, since the structure of the true and false selecting circuits 21 to 24 and the structure of the full adders 31 to 34 are identical to those of the conventional arithmetic unit as shown in FIG. 1.

TABLE 3

| $B_4$ | $T_1$ | $T_2$ | C | Operation |
|---|---|---|---|---|
| 0 | 1 | 0 | 1 | A + B + 1 |
| 1 | 0 | 1 | 0 | A + B |

With respect to the control circuit 10, the combination of the function selecting signals $S_1$ to $S_4$ corresponding to the operating function of the arithmetic unit can be arbitrarily decided by a circuit designer so far as the corresponding relation of the control signals $T_1$, $T_2$ and C (initial carry) and the operation as shown in Table 3 is satisfied when the AMI coding operation function is selected by the function selecting signals $S_1$ to $S_4$. Such a control circuit can be readily formed through a PLA (programmable logic array).

Description is now made on exemplary structure of the control circuit 10.

It is assumed here that corresponding relation as shown in Table 4 is satisfied between combination of the function selecting signals $S_1$ to $S_4$ and the most significant bit $B_4$ of the input signal B and the operation to be performed, for example. It is further assumed that combination other than that of the function selecting signals as shown in Table 4 is inhibited.

The following logical relation results from the relation as shown in Table 4:

$$C = S_1$$

$$T_2 = \overline{S}_4 \cdot \overline{S}_3 \cdot \overline{S}_2 \cdot \overline{S}_1 + \overline{S}_4 \cdot S_3 \cdot S_2 \cdot S_1 + \overline{S}_4 \cdot S_3 \cdot S_2 \cdot \overline{S}_1 + \overline{S}_4 \cdot S_3$$

$$S_2 \cdot S_1 + S_4 \cdot \overline{S}_3 \cdot \overline{S}_2 \cdot \overline{S}_1 \cdot B_4 = \overline{S}_4 \cdot \overline{S}_3 \cdot S_2 + \overline{S}_4 \cdot S_3 \cdot S_2 + S_4 \cdot \overline{S}_3 \cdot \overline{S}_2 \cdot \overline{S}_1 \cdot B_4$$

$$T_1 = S_3 + S_4 \cdot \overline{S}_3 \cdot \overline{S}_2 \cdot \overline{S}_1 \cdot B_4$$

TABLE 4

| T1 | T2 | C | M | OUTPUT (CALCULATION) | B4 | S4 | S3 | S2 | S1 |
|---|---|---|---|---|---|---|---|---|---|
| 0 | 0 | 0 | 0 | F = A | x | 0 | 0 | 0 | 0 |
| 0 | 0 | 1 | 0 | F = A + 1 | x | 0 | 0 | 0 | 1 |
| 0 | 1 | 0 | B | F = A + B | x | 0 | 0 | 1 | 0 |
| 0 | 1 | 1 | B | F = A + B + 1 | x | 0 | 0 | 1 | 1 |
| 1 | 0 | 0 | B | F = A + B | x | 0 | 1 | 0 | 0 |
| 1 | 0 | 1 | B | F = A + B + 1 | x | 0 | 1 | 0 | 1 |
| 1 | 1 | 0 | 1 | F = A − 1 | x | 0 | 1 | 1 | 0 |
| 1 | 1 | 1 | 1 | F = A | x | 0 | 1 | 1 | 1 |
| 0 | 1 | 0 | B | F = A + B | 1 | 1 | 0 | 0 | 0 |
| 1 | 0 | 1 | B | F = A + B + 1 | 0 | 1 | 0 | 0 | 1 | x: DON'T CARE

The products in the above expressions correspond to AND operation and the sums correspond to OR operation. Thus, the above relation is programmed through a PLA as shown in FIG. 6.

Figure 6:
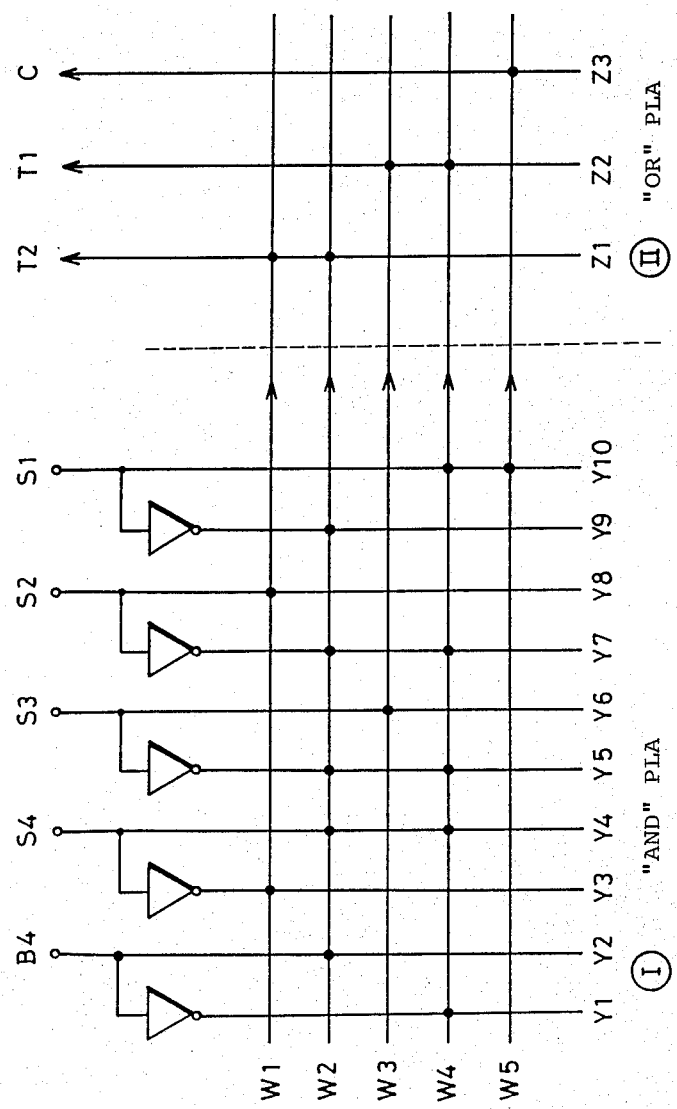
FIG. 6 illustrates the structure of a control circuit provided in the arithmetic unit according to the embodiment of the present invention

FIG. 6 shows exemplary structure of the control circuit 10 formed through a PLA. Referring to FIG. 6, plane I represents "AND" PLA region and plane II represents "OR" PLA region.

In plane I, signals indicated by black circles on signal lines $W_i$ (i=1 to 5) are ANDed to be transferred to plane II.

In plane II, signals indicated by black circles on signal lines $Z_k$ (k=1 to 3) are ORed to be outputted.

Thus, the control circuit 10 can be readily formed through a PLA.

In the aforementioned structure, the program of the PLA is varied with the corresponding relation between the combination of the function selecting signals $S_1$ to $S_4$ and the operation to be performed, as a matter of course.

In the inventive arithmetic unit as hereinabove described, the control circuit controls the functions of the true and false selecting circuits and the initial carry signals to the full adders to perform operation suitable for AMI coding when the AMI coding operation function is selected by the function selecting signals, thereby to AMI code the input signal B with the threshold value of the input signal A in one machine cycle.

Although the above embodiment has been described with reference to a four-bit arithmetic unit, the arithmetic unit may be of any bit number, to attain an effect similar to that of the aforementioned embodiment.

The above described embodiment merely shows an arithmetic unit of the minimum structure capable of performing AMI coding, and the structure of the true and false selecting circuits and the control circuit, operating functions other than AMI coding etc. may be differed so far as the operation as shown in Table 2 can be performed in AMI coding.

According to the present invention as hereinabove described, operation of either $F = A + \overline{B} + 1$ or $F = A + B$ is performed with the input signal A serving as the threshold value in response to the sign of the input signal B to be AMI coded to output the AMI code of the input signal B by utilizing the sign of the operation result F and that of the input signal B, whereby an arithmetic unit which can perform AMI coding of an input signal in one machine cycle without requiring any complicated circuit is implemented. High-speed digital communication can be realized by applying the present invention to a line terminal of a baseband transmission system.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An arithmetic unit for receiving a first input signal of a plurality of bits and a second input signal of a plurality of bits to perform one of a plurality of operations designated by function selecting signals with respect to said first and second input signals, said arithmetic unit comprising:
   means for generating first, second and third control signals being in combination of prescribed values in response to a bit value indicating the sign of said second input signal and said function selecting signals;
   means for selectively outputting either said second input signal or complement of said second input signal in response to said first and second control signals;
   means for adding up said first input signal, output of said selective output means and said third control signal; and
   means for receiving said bit indicating said sign of said second input signal and the most significant bit of output of said addition means to output the alternate mark inversion (AMI) code of said second input signal with a threshold value of said first input signal.

2. An arithmetic unit in accordance with claim 1, wherein said first input signal is a binary number indicating a positive value and said second input signal and said output of said addition means are binary numbers expressed in two's complement form.

3. An arithmetic unit in accordance with claim 1, wherein said selective passing means passes the complement of said second input signal when said second input signal is positive or 0 while outputting said second input signal when said second input signal is negative.

4. An arithmetic unit in accordance with claim 1, wherein said third control signal is "1" when said second input signal is positive or 0 while being "0" when said second input signal is negative.

5. An arithmetic unit in accordance with claim 4, wherein said AMI code is provided by a two-bit binary number having the most significant bit of said output of said addition means as a low order bit and output of said AND means as a high order bit.

6. An arithmetic unit in accordance with claim 1, wherein said AMI coding means includes AND means for receiving the most significant bit of said output of said addition means and the most significant bit of said second input signal.

7. An arithmetic unit in accordance with claim 1, wherein said addition means is formed by a plurality of full adders so that said third control signal is supplied to carry input of a full adder for addition of the least significant bit.

* * * * *